(12) United States Patent
Levy et al.

(10) Patent No.: US 10,079,314 B2
(45) Date of Patent: *Sep. 18, 2018

(54) NONVOLATILE CHARGE TRAP MEMORY DEVICE HAVING A DEUTERATED LAYER IN A MULTI-LAYER CHARGE-TRAPPING REGION

(71) Applicant: Cypress Semiconductor Corporation, San Jose, CA (US)

(72) Inventors: Sagy Charel Levy, Zichron Yaakov (IL); Frederick B. Jenne, Mountain House, CA (US); Krishnaswamy Ramkumar, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/225,152

(22) Filed: Mar. 25, 2014

(65) Prior Publication Data

US 2014/0264550 A1    Sep. 18, 2014

Related U.S. Application Data

(63) Continuation of application No. 11/904,475, filed on Sep. 26, 2007, now Pat. No. 8,680,601.

(Continued)

(51) Int. Cl.
*H01L 29/792*  (2006.01)
*H01L 29/51*  (2006.01)
(Continued)

(52) U.S. Cl.
CPC ...... *H01L 29/792* (2013.01); *H01L 21/28282* (2013.01); *H01L 29/513* (2013.01); *H01L 29/66833* (2013.01)

(58) Field of Classification Search
CPC ............. H01L 29/792; H01L 21/28282; H01L 29/513; H01L 29/66833; H01L 29/511; H01L 27/11563; H01L 29/4234
(Continued)

(56) References Cited

U.S. PATENT DOCUMENTS 4,667,217 A    5/1987  Janning
4,870,470 A    9/1989  Bass, Jr. et al.
(Continued)

FOREIGN PATENT DOCUMENTS

CN    101636845 A    1/2010
CN    101859702 A    10/2010
(Continued)

OTHER PUBLICATIONS

Perkins et al. Diffusion and Permeation of He, Ne, Ar, Kr, and D2 thorugh Silicon Oxide Thin Films, The Journal of Chemical Physics, vol. 54, No. 4, Feb. 1971, pp. 1683-1694.*
(Continued)

*Primary Examiner* — Galina Yushina

(57) ABSTRACT

A nonvolatile charge trap memory device is described. The device includes a substrate having a channel region. A gate stack is disposed above the substrate over the channel region. The gate stack includes a multi-layer charge-trapping region having a first deuterated layer. The multi-layer charge-trapping region may further include a deuterium-free charge-trapping layer.

18 Claims, 6 Drawing Sheets

Related U.S. Application Data

(60) Provisional application No. 60/931,905, filed on May 25, 2007.

(51) Int. Cl.
    *H01L 21/28*     (2006.01)
    *H01L 29/66*     (2006.01)

(58) Field of Classification Search
    USPC ............... 257/314, 390, E29.309, E21.209, 257/E21.613, E21.645, E21.662, E21.692
See application file for complete search history.

(56) References Cited

U.S. PATENT DOCUMENTS

| | | | |
|---|---|---|---|
| 6,187,665 B1 | 2/2001 | Chetlur et al. | |
| 6,218,700 B1 | 4/2001 | Papadas | |
| 6,448,136 B1* | 9/2002 | Chang | H01L 21/28017 257/E21.191 |
| 6,521,977 B1* | 2/2003 | Burnham | H01L 21/3003 257/618 |
| 6,670,241 B1 | 12/2003 | Kamal et al. | |
| 6,677,213 B1* | 1/2004 | Ramkumar | H01L 21/28176 257/E21.194 |
| 6,709,928 B1* | 3/2004 | Jenne | H01L 27/115 257/E21.679 |
| 6,768,160 B1 | 7/2004 | Li et al. | |
| 6,818,558 B1 | 11/2004 | Rathor et al. | |
| 6,884,681 B1 | 4/2005 | Kamal et al. | |
| 6,913,961 B2 | 7/2005 | Hwang | |
| 6,949,433 B1* | 9/2005 | Hidehiko | H01L 21/28282 257/E21.21 |
| 7,042,054 B1 | 5/2006 | Ramkumar et al. | |
| 7,060,594 B2 | 6/2006 | Wang | |
| 7,646,056 B2* | 1/2010 | Choi | H01L 29/513 257/310 |
| 9,716,153 B2 | 7/2017 | Levy et al. | |
| 2003/0122204 A1 | 7/2003 | Nomoto et al. | |
| 2003/0222318 A1* | 12/2003 | Tanaka | H01L 21/28176 257/406 |
| 2004/0217433 A1 | 11/2004 | Yeo et al. | |
| 2004/0251487 A1 | 12/2004 | Wu et al. | |
| 2004/0251521 A1* | 12/2004 | Tanaka | H01L 21/28176 257/639 |
| 2004/0266117 A1 | 12/2004 | Hwang | |
| 2005/0062098 A1 | 3/2005 | Mahajani et al. | |
| 2005/0275010 A1 | 12/2005 | Chen et al. | |
| 2006/0192248 A1* | 8/2006 | Wang | H01L 21/28282 257/324 |
| 2006/0234456 A1* | 10/2006 | Anderson | G11C 16/0475 438/284 |
| 2006/0258090 A1 | 11/2006 | Bhattacharyya et al. | |
| 2006/0267072 A1 | 11/2006 | Bhattacharyya | |
| 2006/0284236 A1 | 12/2006 | Bhattacharyya | |
| 2006/0292781 A1 | 12/2006 | Lee | |
| 2007/0272916 A1* | 11/2007 | Wang | H01L 29/792 257/24 |
| 2008/0067577 A1* | 3/2008 | Wang | G11C 11/5671 257/321 |
| 2008/0087942 A1 | 4/2008 | Hsu et al. | |
| 2008/0191247 A1 | 8/2008 | Yin et al. | |
| 2008/0239818 A1 | 10/2008 | Mokhlesi et al. | |
| 2008/0277720 A1 | 11/2008 | Youn et al. | |
| 2008/0285350 A1* | 11/2008 | Yeh | G11C 16/0466 365/185.17 |
| 2008/0290399 A1 | 11/2008 | Levy et al. | |
| 2009/0020831 A1 | 1/2009 | Ramkumar et al. | |
| 2009/0096017 A1 | 4/2009 | Lai et al. | |
| 2009/0101965 A1 | 4/2009 | Chen et al. | |
| 2009/0179253 A1 | 7/2009 | Levy et al. | |
| 2010/0178759 A1 | 7/2010 | Kim et al. | |
| 2011/0012090 A1 | 1/2011 | Singh et al. | |
| 2013/0107628 A1 | 5/2013 | Dong et al. | |
| 2013/0306975 A1 | 11/2013 | Levy et al. | |

FOREIGN PATENT DOCUMENTS

| | | |
|---|---|---|
| TW | 540086 | 7/2003 |
| TW | 200905867 A | 2/2009 |

OTHER PUBLICATIONS

U.S. Appl. No. 13/539,459 : "NonVolatile Charge Trap Memory Device Having a Deuterated Layer in a Mulit-Layer Charge-Trapping Region" Sagy Levy et al., filed Jul. 1, 2012; 58 pages.
International Search Report for International Application No. PCT/US07/20965 dated Apr. 21, 2008; 2 pages.
International Search Report for International Application No. PCT/US2013/048870 mailed Jun. 12, 2013; 2 pages.
Resenman et al., "Deep Traps in Oxide-Nitride-Oxide Stacks Fabricated from Hydrogen and Deuterium Containing Procursors," Journal of Applied Physics, 99, 2006, pp. 023702-1-023702-5.
SIPO Office Action for Application No. 200780035965.2 dated Sep. 6, 2012; 3 pages.
Taiwanese Office Action for Application No. 096136678.0 dated Jul. 30, 2013; 3 pages.
USPTO Advisory Action for U.S. Appl. No. 11/904,475 dated Mar. 27, 2013; 5 pages.
USPTO Advisory Action for U.S. Appl. No. 11/904,475 dated Nov. 15, 2011; 3 pages.
USPTO Advisory Action for U.S. Appl. No. 11/904,475 dated Nov. 24, 2010; 3 pages.
USPTO Advisory Action for U.S. Appl. No. 13/539,459 dated Mar. 20, 2014; 5 pages.
USPTO Final Rejection for U.S. Appl. No. 11/904,475 dated Jan. 9, 2013; 18 pages.
USPTO Final Rejection for U.S. Appl. No. 11/904,475 dated Sep. 6, 2011; 16 pages.
USPTO Final Rejection for U.S. Appl. No. 11/904,475 dated Sep. 28, 2010; 14 pages.
USPTO Final Rejection for U.S. Appl. No. 13/539,459 dated Dec. 24, 2013; 33 pages.
USPTO Non Final Rejection for U.S. Appl. No. 11/904,475 dated Apr. 12, 2011; 14 pages.
USPTO Non Final Rejection for U.S. Appl. No. 11/904,475 dated Apr. 27, 2010; 12 pages.
USPTO Non Final Rejection for U.S. Appl. No. 13/539,459 dated Jul. 15, 2013; 17 pages.
USPTO Non-Final Rejection for U.S. Appl. No. 11/904,475 dated Sep. 4, 2012; 16 pages.
USPTO Non-Final Rejection for U.S. Appl. No. 11/904,475 dated Sep. 9, 2013; 21 pages.
USPTO Notice of Allowance for U.S. Appl. No. 11/904,475 dated Dec. 23, 2013; 10 pages.
USPTO Requirement for Restriction for U.S. Appl. No. 11/904,475 dated Jan. 8, 2010; 8 pages.
USPTO Requirement for Restriction for U.S. Appl. No. 13/539,459 dated May 6, 2013; 6 pages.
Written Opinion of the International Searching Authority for International Application No. PCT/US07/20965 dated Apr. 21, 2008; 6 pages.
Written Opinion of the International Searching Authority for International Application No. PCT/US13/48870 dated Dec. 6, 2013; 6 pages.
SIPO Office Action for Application No. 200780035965.2 dated Nov. 12, 2010; 7 pages.
Taiwanese Office Action for Application No. 096136678 dated May 21, 2014; 2 pages.
USPTO Non-Final Rejection for U.S. Appl. No. 13/539,459 dated Mar. 5, 2015; 37 pages.
USPTO Notice of Allowance for U.S. Appl. No. 13/539,459 dated Jun. 25, 2015; 8 pages.
TIPO Office Action for Taiwan Application No. 104101261 dated Dec. 11, 2015; 2 pages.
USPTO Non-Final Rejection for U.S. Appl. No. 13/539,459 dated Oct. 27, 2015; 13 pages.

(56) References Cited

OTHER PUBLICATIONS

USPTO Notice of Allowance for U.S. Appl. No. 13/539,459 dated Feb. 4, 2016; 10 pages.
SIPO Office Action for Chinese Patent Application No. CN2013800456408 dated Jan. 13, 2017; 8 pages.
Tipo Office Action for International Application No. 102123445 dated Jan. 10, 2017; 11 pages.
USPTO Non-Final Rejection for U.S. Appl. No. 13/539,459 dated Jun. 30, 2016; 19 pages.
USPTO Non-Final Rejection for U.S. Appl. No. 15/189,547 dated Dec. 23, 2016; 11 pages.
USPTO Notice of Allowance for U.S. Appl. No. 13/539,459 dated Sep. 20, 2016; 8 pages.
USPTO Notice of Allowance for U.S. Appl. No. 15/189,547 dated Apr. 14, 2017; 11 pages.
USPTO Notice of Allowance for U.S. Appl. No. 13/539,459 dated Mar. 21, 2017; 22 pages.
USPTO Requirement for Restriction Election for U.S. Appl. No. 15/189,547 dated Oct. 12, 2016; 7 pages.
USPTO Requirement for Restriction Election for U.S. Appl. No. 15/653,102 dated Mar. 28, 2018; 7 pages.
Kapoor et al. Chemical Composition, Charge Trapping, and Memory Properties of Oxynitride Films for MNOS Devices. Abstract. J. Electrochem. Soc. 137 (1990) 11.
USPTO Non Final Rejection for U.S. Appl. No. 15/653,102 dated Jun. 6, 2018; 33 pages.

\* cited by examiner

NONVOLATILE CHARGE TRAP MEMORY DEVICE HAVING A DEUTERATED LAYER IN A MULTI-LAYER CHARGE-TRAPPING REGION

CROSS REFERENCE TO RELATED APPLICATIONS

This application is a continuation of U.S. application Ser. No. 11/904,475, filed Sep. 26, 2007, now U.S. Pat. No. 8,680,601, issued Mar. 25, 2014, which claims priority to U.S. Provisional Patent Application No. 60/931,905, filed May 25, 2007, all of which are incorporated by reference herein in their entirety.

TECHNICAL FIELD

The invention is in the field of Semiconductor Devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Non-volatile semiconductor memories typically use stacked floating gate type field-effect-transistors. In such transistors, electrons are injected into a floating gate of a memory cell to be programmed by biasing a control gate and grounding a body region of a substrate on which the memory cell is formed. An oxide-nitride-oxide (ONO) stack is used as either a charge storing layer, as in a semiconductor-oxide-nitride-oxide-semiconductor (SONOS) transistor, or as an isolation layer between the floating gate and control gate, as in a split gate flash transistor. FIG. 1 illustrates a cross-sectional view of a conventional nonvolatile charge trap memory device.

Referring to FIG. 1, semiconductor device 100 includes a SONOS gate stack 104 including a conventional ONO portion 106 formed over a silicon substrate 102. Semiconductor device 100 further includes source and drain regions 110 on either side of SONOS gate stack 104 to define a channel region 112. SONOS gate stack 104 includes a poly-silicon gate layer 108 formed above and in contact with ONO portion 106. Poly-silicon gate layer 108 is electrically isolated from silicon substrate 102 by ONO portion 106. ONO portion 106 typically includes a tunnel oxide layer 106A, a nitride or oxy-nitride charge-trapping layer 106B, and a top oxide layer 106C overlying nitride or oxy-nitride layer 106B.

One problem with conventional SONOS transistors is the poor data retention in the nitride or oxy-nitride layer 106B that limits semiconductor device 100 lifetime and its use in several applications due to leakage current through the layer. One attempt to address this problem focused on the use of silicon-rich SONOS layers, which enable a large initial separation between program and erase voltages at the beginning of life but result a rapid deterioration of charge storing ability. Another attempt focused on oxygen-rich layers, which enable a reduced rate of deterioration of charge storing ability, but also reduce the initial separation between program and erase voltages. The effect of both of these approaches on data retention over time may be shown graphically. FIGS. 2 and 3 are plots of Threshold Voltage (V) as a function of Retention Time (Sec) for conventional nonvolatile charge trap memory devices.

Referring to FIG. 2, rapid deterioration of charge storing ability for a silicon-rich layer is indicated by the convergence of the programming threshold voltage (VTP) 202 and erase threshold voltage (VTE) 204 to a specified minimum 206. Referring to FIG. 3, a reduced separation between VTP 302 and VTE 304 is obtained for an oxygen-rich layer. As indicated by line 306, the overall useful lifetime of device is not appreciably extended by this approach.

DETAILED DESCRIPTION

A nonvolatile charge trap memory device and a method to form the same is described herein. In the following description, numerous specific details are set forth, such as specific dimensions, in order to provide a thorough understanding of the present invention. It will be apparent to one skilled in the art that the present invention may be practiced without these specific details. In other instances, well-known processing steps, such as patterning steps or wet chemical cleans, are not described in detail in order to not unnecessarily obscure the present invention. Furthermore, it is to be understood that the various embodiments shown in the Figures are illustrative representations and are not necessarily drawn to scale.

Disclosed herein is a nonvolatile charge trap memory device. The device may include a substrate having a channel region and a pair of source and drain regions. A gate stack may be formed above the substrate over the channel region and between the pair of source and drain regions. In one embodiment, the gate stack includes a multi-layer charge-trapping region having a first deuterated layer. The multi-layer Charge-trapping region may further include a deuterium-free charge-trapping layer. Alternatively, the multi-layer charge-trapping region may include a partially deuterated charge-trapping layer having a deuterium concentration less than that of the first deuterated layer.

A nonvolatile charge trap memory device including a multi-layer charge-trapping region having a deuterated layer may exhibit improved programming and erase speed and data retention. In accordance with an embodiment of the present invention, a deuterated layer is formed between the charge-trapping layer of the multi-layer charge-trapping region and the tunnel dielectric layer. In one embodiment, the deuterated layer is essentially trap-free and mitigates hot electron degradation during erase and program cycles. By incorporating a trap-free layer between the tunnel dielectric layer and the charge-trapping layer of a multi-layer charge-trapping region, the Nit shift from erase and program cycles may be reduced and the retention may be increased. In accordance with another embodiment of the present invention, a second deuterated layer is also formed between the charge-trapping layer of the multi-layer charge-trapping region and a top dielectric layer of the gate stack.

Figure 1:
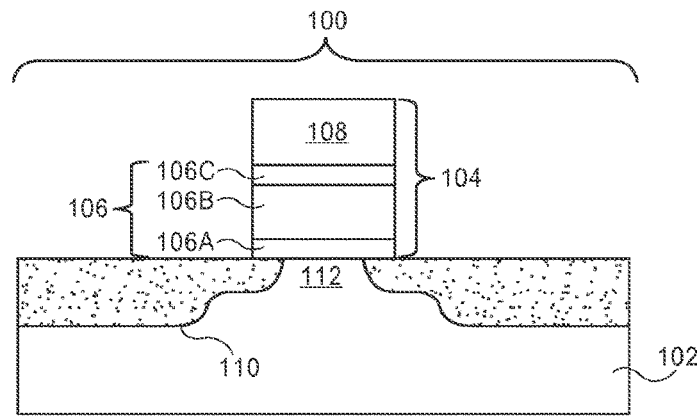
FIG. 1 illustrates a cross-sectional view of a conventional nonvolatile charge trap memory device.
Figure 2:
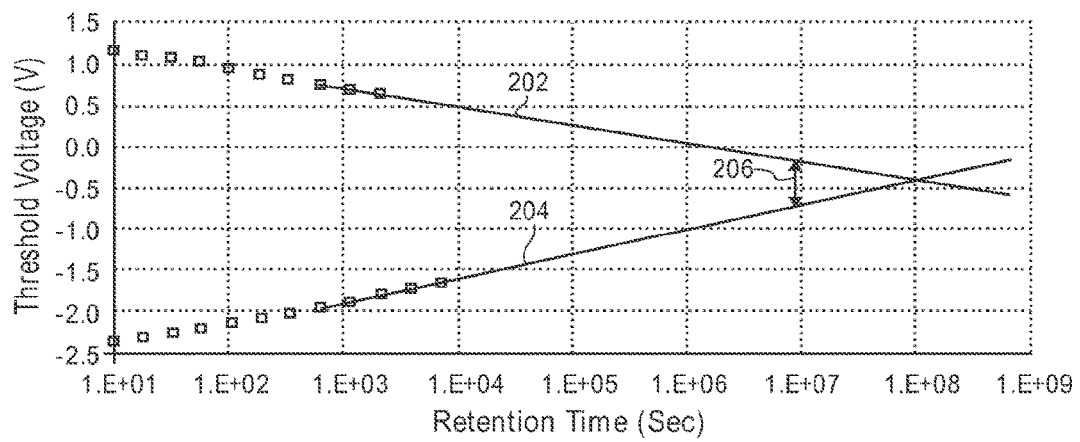
FIG. 2 is a plot of Threshold Voltage (V) as a function of Retention Time (Sec) for a conventional nonvolatile charge trap memory device.
Figure 3:
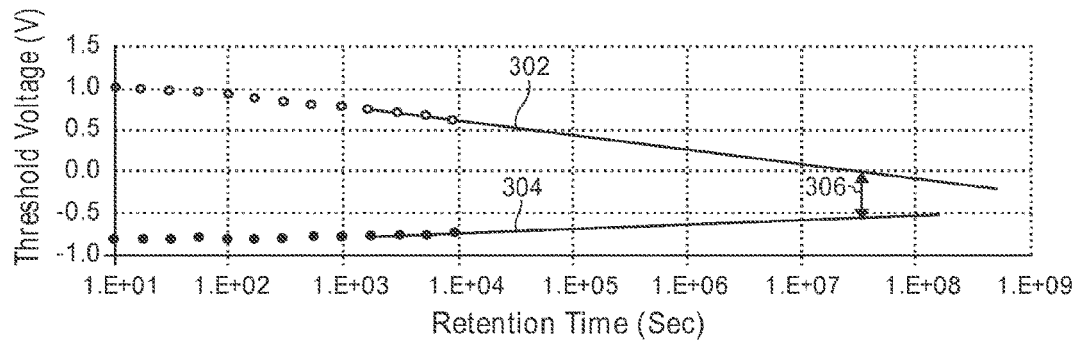
FIG. 3 is a plot of Threshold Voltage (V) as a function of Retention Time (Sec) for a conventional nonvolatile charge trap memory device.
Figure 4:
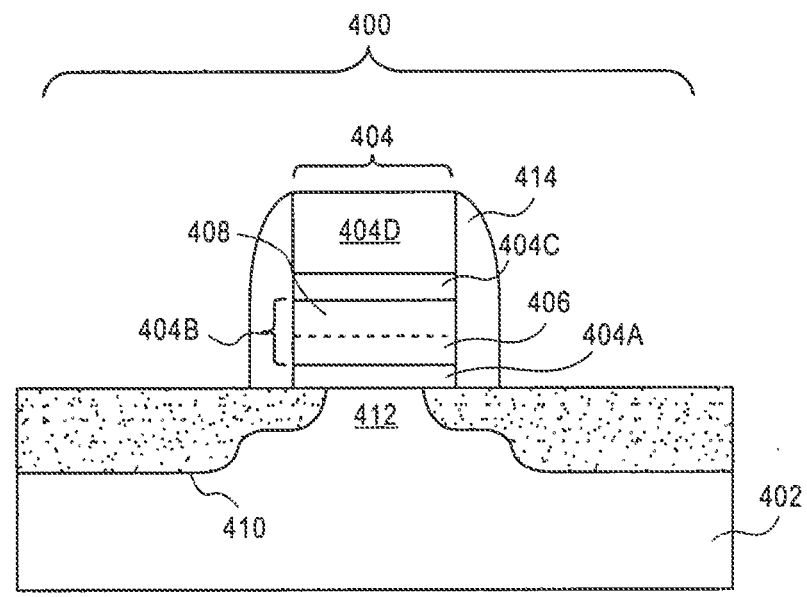
FIG. 4 illustrates a cross-sectional view of a nonvolatile charge trap memory device, in accordance with an embodiment of the present invention.

A nonvolatile charge trap memory device may include a multi-layer charge-trapping region having a deuterated layer. FIG. 4 illustrates a cross-sectional view of a nonvolatile charge trap memory device, in accordance with an embodiment of the present invention.

Referring to FIG. 4, semiconductor device 400 includes a gate stack 404 formed over a substrate 402. Semiconductor device 400 further includes source and drain regions 410 in substrate 402 on either side of gate stack 404, defining a channel region 412 in substrate 402 underneath gate stack 404. Gate stack 404 includes a tunnel dielectric layer 404A, a multi-layer charge-trapping region 404B, a top dielectric layer 404C and a gate layer 404D. Thus, gate layer 404D is electrically isolated from substrate 402. Multi-layer charge-trapping region 404B includes a deuterated layer 406 between a charge-trapping layer 408 of multi-layer charge-trapping region 404B and tunnel dielectric layer 404A. A pair of dielectric spacers 414 isolates the sidewalls of gate stack 404.

Semiconductor device 400 may be any nonvolatile charge trap memory device. In one embodiment, semiconductor device 400 is a Flash-type device wherein the charge-trapping layer is a conductor layer or a semiconductor layer. In accordance with another embodiment of the present invention, semiconductor device 400 is a SONOS type device wherein the charge-trapping layer is an insulator layer. By convention, SONOS stands for "Semiconductor-Oxide-Nitride-Oxide-Semiconductor," where the first "Semiconductor" refers to the channel region material, the first "Oxide" refers to the tunnel dielectric layer, "Nitride" refers to the charge-trapping dielectric layer, the second "Oxide" refers to the top dielectric layer (also known as a blocking dielectric layer) and the second "Semiconductor" refers to the gate layer. A SONOS-type device, however, is not limited to these specific materials, as described below.

Substrate 402 and, hence, channel region 412, may be composed of any material suitable for semiconductor device fabrication. In one embodiment, substrate 402 is a bulk substrate composed of a single crystal of a material which may include, but is not limited to, silicon, germanium, silicon-germanium or a compound semiconductor material. In another embodiment, substrate 402 includes a bulk layer with a top epitaxial layer. In a specific embodiment, the bulk layer is composed of a single crystal of a material which may include, but is not limited to, silicon, germanium, silicon-germanium, a BIN compound semiconductor material and quartz, while the top epitaxial layer is composed of a single crystal layer which may include, but is not limited to, silicon, germanium, silicon-germanium and a III-V compound semiconductor material. In another embodiment, substrate 402 includes a top epitaxial layer on a middle insulator layer which is above a lower bulk layer. The top epitaxial layer is composed of a single crystal layer which may include, but is not limited to, silicon (i.e. to form a silicon-on-insulator (SOI) semiconductor substrate), germanium, silicon-germanium and a III-V compound semiconductor material. The insulator layer is composed of a material which may include, but is not limited to, silicon dioxide, silicon nitride and silicon oxy-nitride. The lower bulk layer is composed of a single crystal which may include, but is not limited to, silicon, germanium, silicon-germanium, a III-V compound semiconductor material and quartz. Substrate 402 and, hence, channel region 412, may include dopant impurity atoms. In a specific embodiment, channel region 412 is doped P-type and, in an alternative embodiment, channel region 412 is doped N-type.

Source and drain regions 410 in substrate 402 may be any regions having opposite conductivity to channel region 412. For example, in accordance with an embodiment of the present invention, source and drain regions 410 are N-type doped regions while channel region 412 is a P-type doped region. In one embodiment; substrate 402 and, hence, channel region 412, is composed of boron-doped single-crystal silicon having a boron concentration in the range of $1 \times 10^{15}$-$1 \times 10^{19}$ atoms/cm$^3$. Source and drain regions 410 are composed of phosphorous- or arsenic-doped regions having a concentration of N-type dopants in the range of $5 \times 10^{16}$-$5 \times$ $10^{19}$ atoms/cm$^3$. In a specific embodiment, source and drain regions 410 have a depth in substrate 402 in the range of 80-200 nanometers. In accordance with an alternative embodiment of the present invention, source and drain regions 410 are P-type doped regions while channel region 412 is an N-type doped region.

Tunnel dielectric layer 404A may be any material and have any thickness suitable to allow charge carriers to tunnel into the charge-trapping layer under an applied gate bias while maintaining a suitable barrier to leakage when the device is unbiased. In one embodiment, tunnel dielectric layer 404A is formed by a thermal oxidation process and is composed of silicon dioxide or silicon oxy-nitride, or a combination thereof. In another embodiment, tunnel dielectric layer 404A is formed by chemical vapor deposition or atomic layer deposition and is composed of a dielectric layer which may include, but is not limited to, silicon nitride, hafnium oxide, zirconium oxide, hafnium silicate, hafnium oxy-nitride, hafnium zirconium oxide and lanthanum oxide. In a specific embodiment, tunnel dielectric layer 404A has a thickness in the range of 1-10 nanometers. In a particular embodiment, tunnel dielectric layer 404A has a thickness of approximately 2 nanometers.

Multi-layer charge-trapping region 404B may be composed of any material and have any thickness suitable to store charge and, hence, raise the threshold voltage of gate stack 404. In one embodiment, multi-layer charge-trapping region 404B is formed by a chemical vapor deposition process and is composed of a dielectric material which may include, but is not limited to, stoichiometric silicon nitride, silicon-rich silicon nitride and silicon oxy-nitride. In accordance with an embodiment of the present invention, multi-layer charge-trapping region 404B includes a deuterated layer 406 between tunnel dielectric layer 404A and charge trapping layer 408, as depicted in FIG. 4. Deuterated layer 406 and charge-trapping layer 408 may be composed of a deuterated derivative and a non-deuterated derivative, respectively, of the same material. For example, in accordance with an embodiment of the present invention, deuterated layer 406 is a deuterated derivative of silicon oxy-nitride, while charge-trapping layer 408 is formed from the hydrogenated derivative of silicon oxy-nitride. In one embodiment, the total thickness of multi-layer charge-trapping region 404B is in the range of 5-10 nanometers. In a specific embodiment, the ratio of thicknesses of deuterated layer 406:charge-trapping layer 408 is approximately 1:1, respectively.

Multi-layer charge-trapping region 404B may have an abrupt interface between deuterated layer 406 and charge-trapping layer 408. That is, in accordance with an embodiment of the present invention, charge-trapping layer 408 is deuterium-free. Alternatively, a gradient of deuterium atom concentration moving from high concentration of deuterium in deuterated layer 406 ranging to low concentration of deuterium in charge-trapping layer 408 may be formed. Thus, in accordance with an alternative embodiment of the present invention, charge-trapping layer 408 is a partially deuterated layer, but having a deuterium concentration less than that of deuterated layer 406.

Top dielectric layer 404C may be any material and have any thickness suitable to maintain a barrier to charge leakage without significantly decreasing the capacitance of gate stack 404. In one embodiment, top dielectric layer 404C is formed by a chemical vapor deposition process and is composed of silicon dioxide, silicon oxy-nitride, silicon nitride, or a combination thereof. In another embodiment, top dielectric layer 404C is formed by atomic layer deposition and is composed of a high-k dielectric layer which may include, but is not limited to, hafnium oxide, zirconium oxide, hafnium silicate, hafnium oxy-nitride, hafnium zirconium oxide and lanthanum oxide. In a specific embodiment, top dielectric layer 404C has a thickness in the range of 1-20 nanometers.

Gate layer 404D may be composed of any conductor or semiconductor material suitable for accommodating a bias during operation of a SONOS-type transistor. In accordance with an embodiment of the present invention, gate layer 404D is formed by a chemical vapor deposition process and is composed of doped poly-crystalline silicon. In another embodiment, gate layer 404D is formed by physical vapor deposition and is composed of a metal-containing material which may include, but is not limited to, metal nitrides, metal carbides, metal silicides, hafnium, zirconium, titanium, tantalum, aluminum, ruthenium, palladium, platinum, cobalt and nickel.

Figure 5:
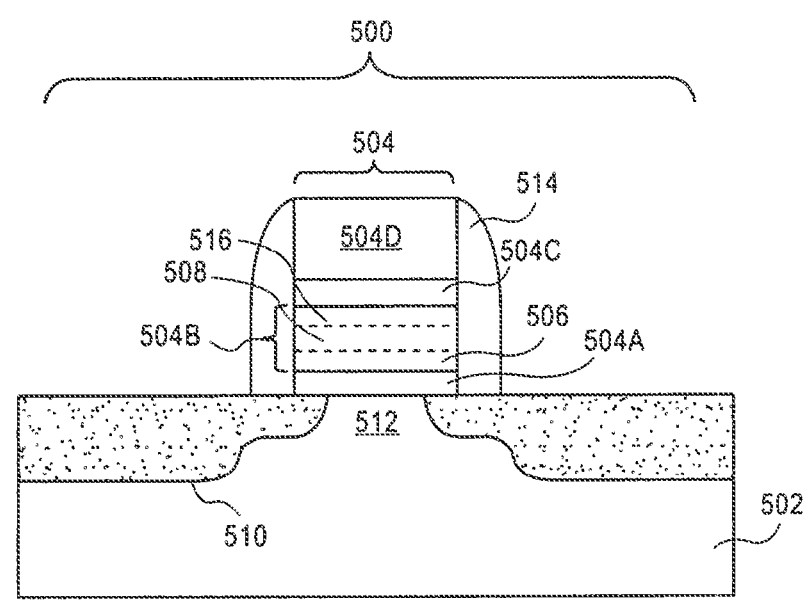
FIG. 5 illustrates a cross-sectional view of a nonvolatile charge trap memory device, in accordance with an embodiment of the present invention.

A nonvolatile charge trap memory device may include a multi-layer charge-trapping region having more than one deuterated layer. FIG. 5 illustrates a cross-sectional view of a nonvolatile charge trap memory device, in accordance with an embodiment of the present invention.

Referring to FIG. 5, semiconductor device 500 includes a gate stack 504 formed over a substrate 502. Semiconductor device 500 further includes source and drain regions 510 in substrate 502 on either side of gate stack 504, defining a channel region 512 in substrate 502 underneath gate stack 504. Gate stack 504 includes a tunnel dielectric layer 504A, a multi-layer charge-trapping region 504B, a top dielectric layer 504C and a gate layer 504B. Thus, gate layer 504D is electrically isolated from substrate 502. Multi-layer charge-trapping region 504B includes a first deuterated layer 506 and a second deuterated layer 516 sandwiching charge-trapping layer 508 of multi-layer charge-trapping region 504B. A pair of dielectric spacers 514 isolates the sidewalls of gate stack 504.

Semiconductor device 500 may be any semiconductor device described in association with semiconductor device 400 from FIG. 4. Substrate 502, source and drain regions 510 and channel region 512 may be composed of any material and dopant impurity atoms described in association with substrate 402, source and drain regions 410 and channel region 412, respectively, from FIG. 4. Tunnel dielectric layer 504A, top dielectric layer 504C and gate layer 504D may be composed of any material described in association with tunnel dielectric layer 404A, top dielectric layer 404C and gate layer 404I, respectively, from FIG. 4.

However, in contrast to semiconductor device 400, semiconductor device includes a multi-layer charge-trapping region 504B having second deuterated layer 516 above charge trapping layer 508, as depicted in FIG. 5. First deuterated layer 506 and charge-trapping layer 508 may be composed of any material described in association with deuterated layer 406 and charge-trapping layer 408, respectively, from FIG. 4. Additionally, second deuterated layer 516 may also be composed of any material described in association with deuterated layer 406 from FIG. 4. However, in accordance with an embodiment of the present invention, the total thickness of multi-layer charge-trapping region 504B is in the range of 5-10 nanometers, i.e. multi-layer charge-trapping region 504B has a thickness in the same range as multi-layer charge-trapping region 404B from FIG. 4. Thus, the relative ratios of thicknesses of deuterated layers and the charge-trapping layer may differ from those of semiconductor device 400. For example, in one embodiment, the ratio of thicknesses of first deuterated layer 506:charge-trapping layer 508:second deuterated layer 516 is approximately 1:2:1, respectively.

As with multi-layer charge-trapping region 404B from FIG. 4, multi-layer charge-trapping region 504B may have an abrupt interface between first deuterated layer 506 and charge-trapping layer 508. Likewise, as second abrupt interface may exist between second deuterated layer 516 and charge-trapping layer 508. That is, in accordance with an embodiment of the present invention, charge-trapping layer 508 is deuterium-free. Alternatively, a gradient of deuterium atom concentration moving from high concentration of deuterium in first and second deuterated layers 506 and 516 ranging to low concentration of deuterium in charge-trapping layer 508 may be formed. Thus, in accordance with an alternative embodiment of the present invention, charge-trapping layer 508 is a partially deuterated layer, but having a deuterium concentration less than that of deuterated layers 506 and 516.

A nonvolatile charge trap memory device may be fabricated to include a multi-layer charge-trapping region having a deuterated layer. FIGS. 6A-I illustrate cross-sectional views representing steps in the formation of a nonvolatile charge trap memory device, in accordance with an embodiment of the present invention.

Figure 6A:
FIG. 6A illustrates a cross-sectional view representing a step in the formation of a nonvolatile charge trap memory device, in accordance with an embodiment of the present invention.

Referring to FIG. 6A, a substrate 602 is provided. Substrate 602 may be composed of any material and have any characteristics described in association with substrates 402 and 502 from FIGS. 4 and 5, respectively.

Figure 6B:
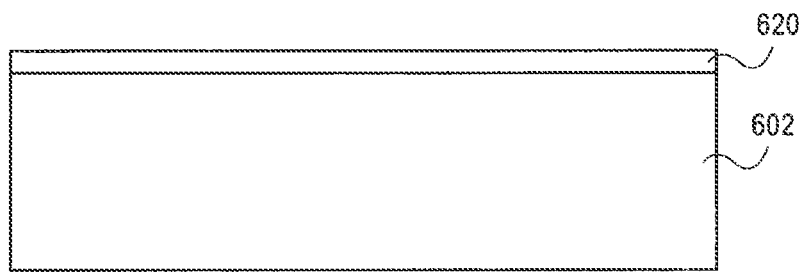
FIG. 6B illustrates a cross-sectional view representing a step in the formation of a nonvolatile charge trap memory device, in accordance with an embodiment of the present invention.

Referring to FIG. 6B, a tunnel dielectric layer 620 is formed on the top surface of substrate 602. Tunnel dielectric layer 620 may be formed from any material, from any process, and have any thickness described in association with tunnel dielectric layers 404A and 504A from FIGS. 4 and 5, respectively.

Figure 6C:
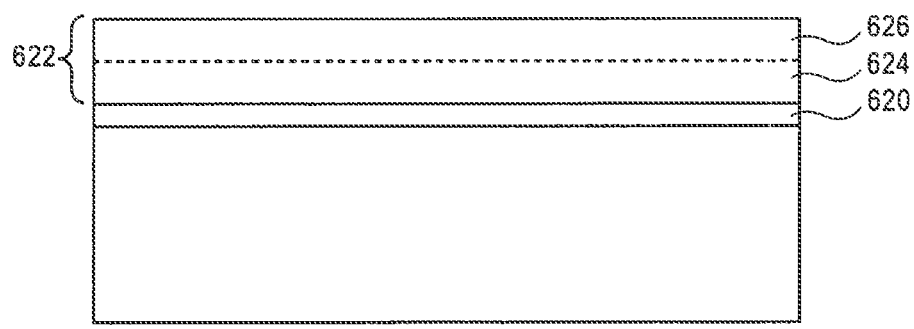
FIG. 6C illustrates a cross-sectional view representing a step in the formation of a nonvolatile charge trap memory device, ire accordance with an embodiment of the present invention.

Referring to FIG. 6C, a multi-layer charge-trapping region 622 is formed on the top surface of tunnel dielectric layer 620. In accordance with an embodiment of the present invention, multi-layer charge-trapping region 622 includes a deuterated layer 624 between tunnel dielectric layer 620 and a charge-trapping layer 626, as depicted in FIG. 6C. Deuterated layer 624 and charge-trapping layer 626 may be composed of any materials and have any thicknesses described in association with deuterated layer 406 and charge-trapping layer 408, respectively, from FIG. 4. Multi-layer charge-trapping region 622 and, hence, deuterated layer 624 and charge-trapping layer 626 may be formed by any process suitable to provide substantially uniform coverage above tunnel dielectric layer 620. In accordance with an embodiment of the present invention, multi-layer charge-trapping region 622 is formed by a chemical vapor deposition process. In one embodiment, deuterated layer 624 is formed first using deuterated formation gases and, subsequently, charge-trapping layer 626 is formed next using non-deuterated formation gases. In a specific embodiment, multi-layer charge-trapping region 622 is composed substantially of silicon oxy-nitride, wherein deuterated layer 624 is first formed using formation gases such as, but not limited to, deuterated silane ($SiD_4$), deuterated dichlorosilane ($SiD_2Cl_2$), nitrous oxide ($N_2O$), deuterated ammonia ($ND_3$) and oxygen ($O_2$). Charge-trapping layer 626 is then formed using formation gases such as, but not limited to, non-deuterated-bis(tert-butylamino)silane (non-deuterated-BTBAS), silane ($SiH_4$), dichlorosilane ($SiH_2O_2$), $N_2O$, ammonia ($NH_3$) and $O_2$. In a particular embodiment, deuterated layer 624 and charge-trapping layer 626 are formed in the same process step, i.e. they are formed in the same process chamber with a seamless transition from deuterated formation gases to non-deuterated formation gases.

An abrupt deuterated and non-deuterated junction may be present at the interface of deuterated layer 624 and charge-trapping layer 626. Thus, in accordance with an embodiment of the present invention, charge-trapping layer 626 remains deuterium-free. Alternatively, some of the deuterium present in deuterated layer 624 may migrate to charge-trapping layer 626 during the deposition of charge-trapping layer 626 or during subsequent high temperature process steps. That is, a gradient of deuterium atom concentration moving from high concentration of deuterium in deuterated layer 624 ranging to low concentration of deuterium in charge-trapping layer 626 may be formed. Thus, in accordance with an alternative embodiment of the present invention, charge-trapping layer 626 becomes a partially deuterated layer, but having a deuterium concentration less than that of deuterated layer 624. In a specific embodiment, deuterated formation gases are employed to form a partially deuterated charge-trapping layer 626 having a deuterium concentration less than that of deuterated layer 624.

Figure 6D:
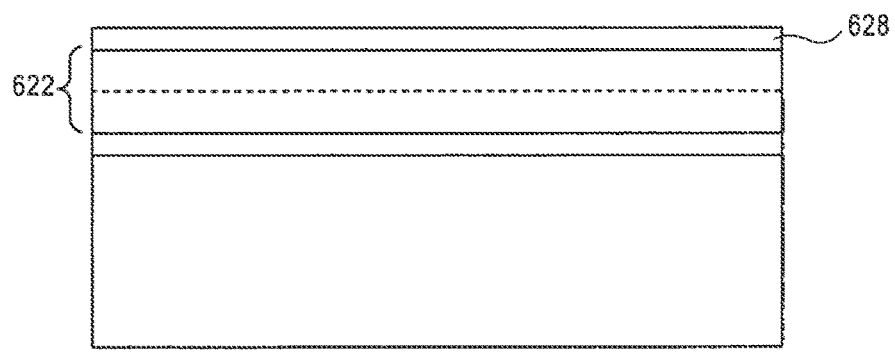
FIG. 6D illustrates a cross-sectional view representing a step in the formation of a nonvolatile charge trap memory device, in accordance with an embodiment of the present invention.

Referring to FIG. 6D, a top dielectric layer 628 is formed on the top surface of multi-layer charge-trapping region 622. Top dielectric layer 628 may be formed from any material, from any process, and have any thickness described in association with top dielectric layers 404C and 504C from FIGS. 4 and 5, respectively. In accordance with an alternative embodiment of the present invention, top dielectric layer 628 is formed by using deuterated formation gases. In such an embodiment, deuterated top dielectric layer 628 subsequently acts as a source of deuterium to form a trap-free layer in multi-layer charge-trapping region 622 during a subsequent anneal process. In a specific alternative embodiment, deuterated top dielectric layer 628 is formed using formation gases such as, but not limited to, $SiD_4$, $SiD_2Cl_2$ and $N_2O$.

Figure 6E:
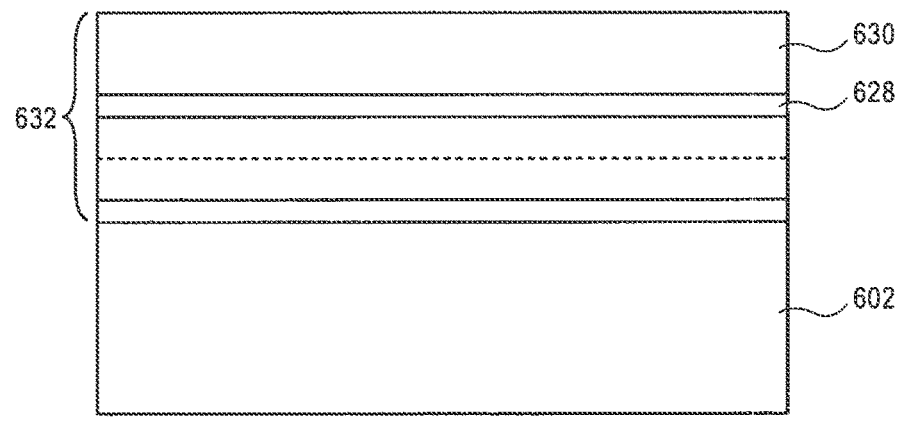
FIG. 6E illustrates a cross-sectional view representing a step in the formation of a nonvolatile charge trap memory device, in accordance with an embodiment of the present invention.

Referring to FIG. 6E, a gate layer 630 is formed on the top surface of top dielectric layer 628. Gate layer 630 may be formed from any material and from any process described in association with gate layers 404D and 504D from FIGS. 4 and 5, respectively. Thus, a gate stack 632 may be formed above substrate 602.

Figure 6F:
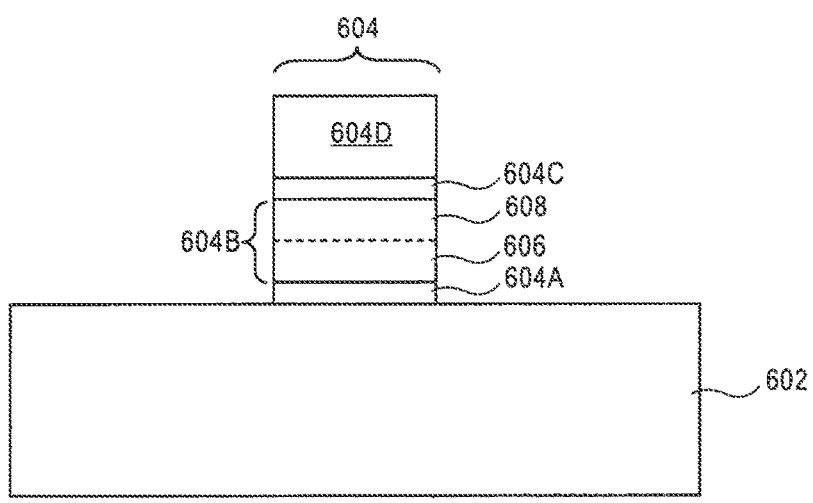
FIG. 6F illustrates a cross-sectional view representing a step in the formation of a nonvolatile charge trap memory device, in accordance with an embodiment of the present invention.

Referring to FIG. 6F, gate stack 632 is patterned to form a patterned gate stack 604 above substrate 602. Patterned gate stack 604 includes a patterned tunnel dielectric layer 604A, a patterned multi-layer charge-trapping region 604B, a patterned top dielectric layer 604C, and a patterned gate layer 604B Patterned multi-layer charge-trapping region 604B includes a patterned deuterated layer 606 and a patterned charge-trapping layer 608. Gate stack 632 may be patterned to form patterned gate stack 604 by any process suitable to provide substantially vertical sidewalls for gate stack 604 with high selectivity to substrate 602. In accordance with an embodiment of the present invention, gate stack 632 is patterned to form patterned gate stack 604 by a lithography and etch process. In a specific embodiment, the etch process is an anisotropic etch process utilizing gases such as, but not limited to, carbon tetrafluoride ($CF_4$), $O_2$, hydrogen bromide (HBr) and chlorine ($Cl_2$).

Figure 6G:
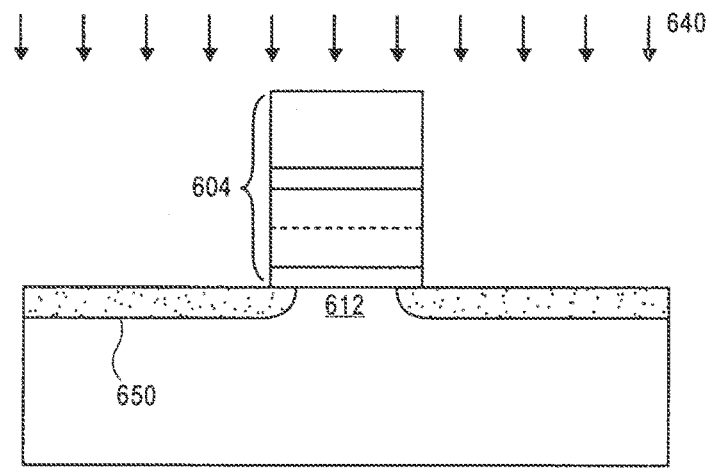
FIG. 6G illustrates a cross-sectional view representing a step in the formation of a nonvolatile charge trap memory device, in accordance with an embodiment of the present invention.
Figure 6H:
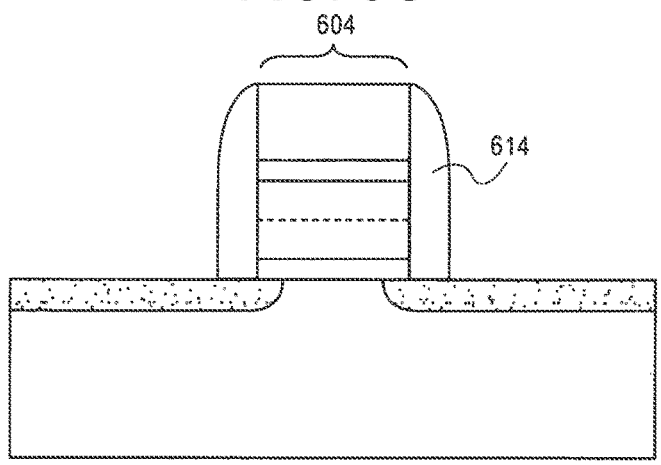
FIG. 6H illustrates a cross-sectional view representing a step in the formation of a nonvolatile charge trap memory device, in accordance with an embodiment of the present invention.

Referring to FIG. 6G, it may be desirable to implant dopant impurity atoms 640 into the exposed portions of substrate 604 to form source and drain tip extension regions 650. Source and drain tip extension regions 650 will ultimately become part of source and drain regions subsequently formed, as described below. Thus, by forming source and drain tip extension regions 650 as defined by the location of patterned gate stack 604, channel region 612 may be defined, as depicted in FIG. 6G. In one embodiment, the conductivity type and the concentration of dopant impurity atoms used to form source and drain tip extension regions 650 are substantially the same as those used to form source and drain regions, described below.

Figure 6I:
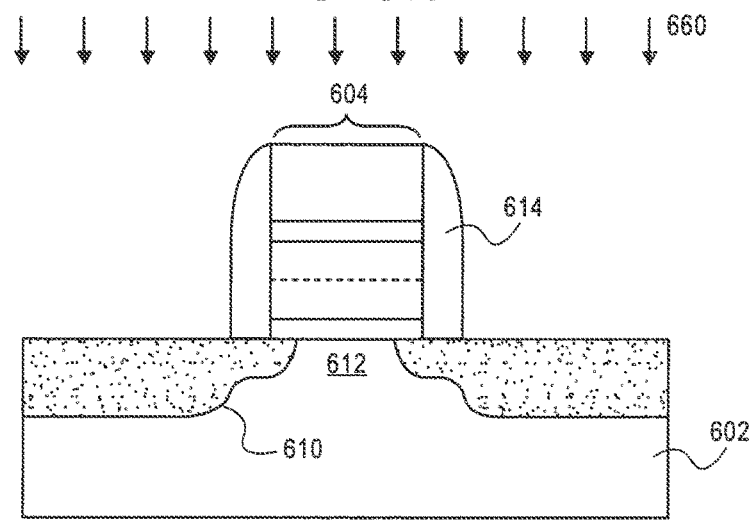
FIG. 6I illustrates a cross-sectional view representing a step in the formation of a nonvolatile charge trap memory device, in accordance with an embodiment of the present invention.

Referring to FIG. 6B, it may be desirable to form a pair of dielectric spacers 614 on the sidewalls of patterned gate stack 604. Finally, referring to FIG. 6I, source and drain regions 610 are formed by implanting dopant impurity atoms 660 into the exposed portions of substrate 604. Source and drain regions 610 may have any characteristics as those described in association with source and drain regions 410 and 510 from FIGS. 4 and 5, respectively. In accordance with an embodiment of the present invention, the profile of source and drain regions 610 is defined by dielectric spacers 614, patterned gate stack 604 and source and drain tip extension regions 650, as depicted in FIG. 6I.

Figure 7A:
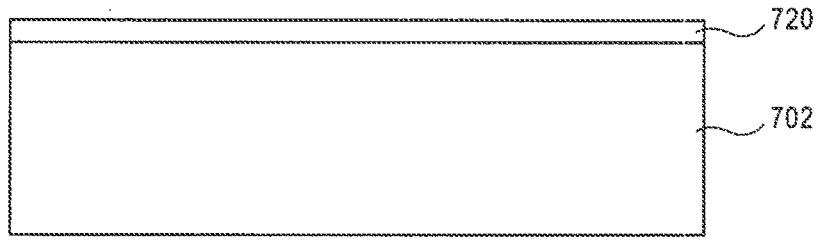
FIG. 7A illustrates a cross-sectional view representing a step in the formation of a nonvolatile charge trap memory device, in accordance with an embodiment of the present invention.
Figure 7B:
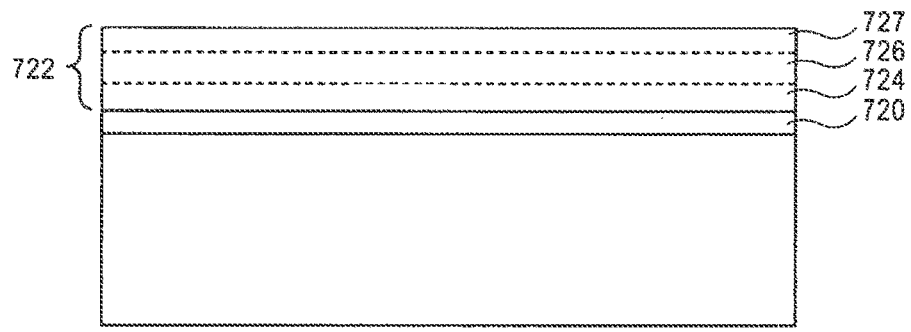
FIG. 7B illustrates a cross-sectional view representing a step in the formation of a nonvolatile charge trap memory device, in accordance with an embodiment of the present invention.
Figure 7C:
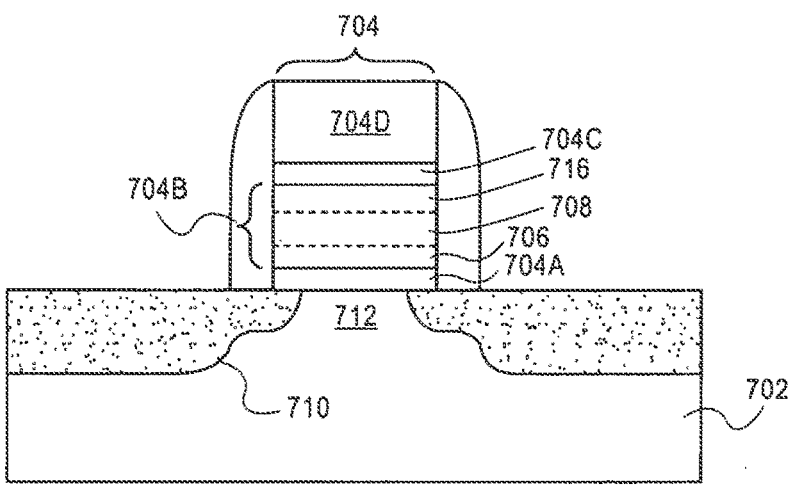
FIG. 7C illustrates a cross-sectional view representing a step in the formation of a nonvolatile charge trap memory device, in accordance with an embodiment of the present invention.

A nonvolatile charge trap memory device may be fabricated to include a multi-layer charge-trapping region having more than one deuterated layer. FIGS. 7A-C illustrate cross-sectional views representing steps in the formation of a nonvolatile charge trap memory device, in accordance with an embodiment of the present invention.

Referring to FIG. 7A, a tunnel dielectric layer 720 formed on the top surface of a substrate 702 is provided. Substrate 702 may be composed of any material and have any characteristics described in association with substrates 402 and 502 from FIGS. 4 and 5, respectively. Tunnel dielectric layer 720 may be formed from any material, from any process, and have any thickness described in association with tunnel dielectric layers 404A and 504A from FIGS. 4 and 5, respectively.

Referring to FIG. 7B, a multi-layer charge-trapping region 722 is formed on the top surface of tunnel dielectric layer 720. In accordance with an embodiment of the present invention, multi-layer charge-trapping region 722 includes a first deuterated layer 724 between tunnel dielectric layer 720 and a charge-trapping layer 726. Additionally multi-layer charge-trapping region 722 includes a second deuterated layer 727 on the top surface of charge-trapping layer 726, as depicted in FIG. 7B. First deuterated layer 724, charge-trapping layer 726, and second deuterated layer 727 may be composed of any materials and have any thicknesses described in association with first deuterated layer 506, charge-trapping layer 508, and second deuterated layer 516, respectively, from FIG. 5. Multi-layer charge-trapping region 722 and, hence, first and second deuterated layers 724 and 727 and charge-trapping layer 726 may be formed by any process suitable to provide substantially uniform coverage above tunnel dielectric layer 720. In accordance with an embodiment of the present invention, multi-layer charge-trapping region 722 is formed by a chemical vapor deposition process. In one embodiment, first deuterated layer 724 is formed first using deuterated formation gases, charge-trapping layer 726 is formed next using non-deuterated formation gases and, finally, second deuterated layer 727 is formed using deuterated formation gases. In a specific embodiment, multi-layer charge-trapping region 722 is composed substantially of silicon oxy-nitride, wherein first deuterated layer 724 is formed first using formation gases such as, but not limited to, $SiD_4$, $SiD_2Cl_2$, $N_2O$, $ND_3$ and $O_2$. Charge-trapping layer 626 is then formed using formation gases such as, but not limited to, non-deuterated-BTBAS, $SiH_4$, $SiH_2Cl_2$, $N_2O$, $NH_3$ and $O_2$. Finally, second deuterated layer 727 is formed using formation gases such as, but not limited to, $SiD_4$, $SiD_2Cl_2$, $N_2O$, $ND_3$ and $O_2$. In a particular embodiment, first deuterated layer 724, charge-trapping layer 726 and second deuterated layer 727 are formed in the same process step, i.e. in the same process chamber with a seamless transition from deuterated formation gases to non-deuterated formation gases and back to deuterated formation gases.

An abrupt deuterated and non-deuterated junction may be present at the interfaces of first deuterated layer 724, second deuterated layer 727 and charge-trapping layer 726. Thus, in accordance with an embodiment of the present invention, charge-trapping layer 726 remains deuterium-free. Alternatively, some of the deuterium present in first and second deuterated layers 724 and 727 may migrate to charge-trapping layer 726 during the deposition of charge-trapping layer 726 and second deuterated layer 727 or during subsequent high temperature process steps. That is, a gradient of deuterium atom concentration moving from high concentration of deuterium in first and second deuterated layers 724 and 727 ranging to low concentration of deuterium in charge-trapping layer 726 may be formed. Thus, in accordance with an alternative embodiment of the present invention, charge-trapping layer 726 becomes a partially deuterated layer, but having a deuterium concentration less than that of first and second deuterated layers 724. In a specific embodiment, deuterated formation gases are employed to form a partially deuterated charge trapping layer 726 having a deuterium concentration less than that of deuterated layer 724.

Referring to FIG. 7C, process steps similar to those described in association with FIGS. 6D-I are carried out to form a nonvolatile charge trap memory device having more than one deuterated layer. Thus, a patterned gate stack 704 is formed over a substrate 702. Source and drain regions 710 are formed on either side of patterned gate stack 704, defining a channel region 712. Patterned gate stack 704 includes a patterned tunnel dielectric layer 704A, a patterned multi-layer charge-trapping region 704B, a patterned top dielectric layer 704C and a patterned gate layer 704D. Patterned multi-layer charge-trapping region 704B includes a patterned first deuterated layer 706 and a patterned second deuterated layer 716 sandwiching patterned charge-trapping layer 708.

Thus, a nonvolatile charge trap memory device has been disclosed. The device includes a substrate having a channel region and a pair of source and drain regions. A gate stack is above the substrate over the channel region and between the pair of source and drain regions. In accordance with an embodiment of the present invention, the gate stack includes a multi-layer charge-trapping region having a first deuterated layer. In one embodiment, the multi-layer charge-trapping region further includes a deuterium-free charge-trapping layer. In an alternative embodiment, the multi-layer charge-trapping region includes a partially deuterated charge-trapping layer having a deuterium concentration less than that of the first deuterated layer.

What is claimed is:
1. A nonvolatile charge trap memory device, comprising:
a gate stack disposed above a channel region of a substrate, wherein the gate stack comprises a multi-layer charge-trapping region comprising a first layer and a second layer that is deuterium-free, the first layer disposed between the channel region and the second layer, wherein the first layer comprises a first deuterium concentration, and wherein the multi-layer charge-trapping region further comprises a third layer, the second layer is disposed between the first layer and the third layer, wherein the third layer comprises a second deuterium concentration, and wherein a first abrupt interface is defined by a junction that separates a finite deuterium concentration of the first layer from a zero deuterium concentration of the second layer.

2. The nonvolatile charge trap memory device of claim 1, wherein the second layer is a charge trapping layer.

3. The nonvolatile charge trap memory device of claim 1, further comprising:
a dielectric layer disposed above the multi-layer charge-trapping region.

4. The nonvolatile charge trap memory device of claim 3, wherein the dielectric layer is a high-k dielectric layer comprising at least one of hafnium oxide, zirconium oxide, hafnium silicate, hafnium oxy-nitride, hafnium zirconium oxide, or lanthanum oxide.

5. The nonvolatile charge trap memory device of claim 3, wherein the dielectric layer comprises deuterium.

6. The nonvolatile charge trap memory device of claim 3, wherein a thickness of the dielectric layer is in a range of 1-20 nanometers.

7. The nonvolatile charge trap memory device of claim 3, further comprising:
a metallic gate layer disposed above the dielectric layer.

8. The nonvolatile charge trap memory device of claim 1, wherein the gate stack is further disposed between a source region and a drain region.

9. A nonvolatile charge trap memory device, comprising:
a gate stack disposed over a channel region of a substrate, wherein the gate stack comprises:
a tunnel layer on a top surface of the substrate over the channel region; and
a multi-layer charge-trapping region having a first deuterated layer on the tunnel layer and a second deuterium-free charge-trapping layer on the first deuterated layer,
wherein the second deuterium-free charge-trapping layer comprises a trap-dense, oxygen-lean nitride layer and includes a majority of charge traps distributed in the multi-layer charge-trapping region, and wherein a first abrupt interface is defined by a junction that separates a finite deuterium concentration of the first deuterated layer from a zero deuterium concentration of the second deuterium-free charge-trapping layer.

10. The nonvolatile charge trap memory device of claim 9, further comprising:
a dielectric layer disposed above the multi-layer charge-trapping region.

11. The nonvolatile charge trap memory device of claim 10, wherein the dielectric layer is a high-k dielectric layer comprising at least one of hafnium oxide, zirconium oxide, hafnium silicate, hafnium oxy-nitride, hafnium zirconium oxide, or lanthanum oxide.

12. The nonvolatile charge trap memory device of claim 10, wherein the dielectric layer comprises deuterium.

13. The nonvolatile charge trap memory device of claim 9, further comprising:
a metallic gate layer disposed above the dielectric layer.

14. The nonvolatile charge trap memory device of claim 9, wherein the gate stack is further disposed between a source region and a drain region.

15. The nonvolatile charge trap memory device of claim 1, further comprising a second abrupt interface that is defined by a junction that separates a finite deuterium concentration of the third layer from the zero deuterium concentration of the second layer.

16. A method comprising:
forming a tunnel dielectric layer on a top surface of a substrate; and
forming a multi-layer charge trapping region on the top surface of the tunnel dielectric layer, wherein the multi-layer charge trapping region comprises a first layer and a second layer, the first layer disposed between the tunnel dielectric layer and the second layer, wherein the first layer comprises a first deuterium concentration, and wherein the multi-layer charge-trapping region further comprises a third layer, wherein the second layer is between the first layer and the third layer and deuterium-free, wherein the third layer comprises a second deuterium concentration, and wherein a first abrupt interface is defined by a junction that separates a finite deuterium concentration of the first layer from a zero deuterium concentration of the second layer.

17. The method of claim 16, further comprising:
forming a high-k dielectric layer disposed on the top surface of the third layer, the high-k dielectric layer comprising at least one of hafnium oxide, zirconium oxide, hafnium silicate, hafnium oxy-nitride, hafnium zirconium oxide, or lanthanum oxide.

18. The method of 16, wherein a second abrupt interface is defined by a junction that separates a finite deuterium concentration of the third layer from the zero deuterium concentration of the second layer.

* * * * *